United States Patent [19]

Monson et al.

[11] 4,302,067

[45] Nov. 24, 1981

[54] EDGE CONNECTORS FOR CIRCUIT CARDS AND METHODS OF ASSEMBLY

[75] Inventors: Randy R. Monson, Indianapolis; Robert L. O'Neal, Greenwood, both of Ind.

[73] Assignee: Western Electric Company, Incorporated, New York, N.Y.

[21] Appl. No.: 141,499

[22] Filed: Apr. 18, 1980

[51] Int. Cl.³ ............................................. H01R 11/06
[52] U.S. Cl. ................................................. 339/275 R
[58] Field of Search ........... 339/258 R, 258 P, 275 R, 339/275 B, 275 T

[56] References Cited

U.S. PATENT DOCUMENTS

| 3,750,265 | 8/1973 | Cushman | 29/471.3 |
| 4,019,803 | 4/1977 | Schell | 339/275 B |
| 4,120,558 | 10/1978 | Seidler | 339/275 T |
| 4,203,648 | 5/1980 | Seidler | 339/275 T |

Primary Examiner—Joseph H. McGlynn
Attorney, Agent, or Firm—J. L. Landis; R. F. Kip, Jr.

[57] ABSTRACT

An edge connector (10) and method of assembly for making electrical contact with contact pad areas (11) along an edge of a circuit card (12), such as a thin film circuit or thick film circuit. The connector includes a spring clip (20) having a set of three spring fingers (21-22-23) projecting therefrom and offset to define a space (24) between the fingers into which the circuit card can be inserted (A) to pre-assemble the card with the clip. The central tine (22) is crimped about a solder preform (30) so as to deform the preform into an hourglass configuration in which the ends of the preform contact the surface of the card. The preform is then melted to form a solder joint (50) bonding the connector to the circuit card.

10 Claims, 5 Drawing Figures

EDGE CONNECTORS FOR CIRCUIT CARDS AND METHODS OF ASSEMBLY

TECHNICAL FIELD

This application relates generally to edge connectors for circuit cards and methods of assembly, and more particularly to spring clip contacts and methods of assembly in which the clip carries a solder preform to be melted so as to bond portions of the clip to a contact pad area on the circuit card.

BACKGROUND OF THE INVENTION

In the past, it has been known to provide connections to contact pads formed along the edges of a circuit card, particularly a thin-film or thick-film circuit having a rigid substrate, using an edge connector in the form of a spring clip having at least three resilient fingers or tines for engaging and holding portions of the card. In a typical example, as disclosed in J. Seilder U.S. Pat. No. 4,120,558 (herein incorporated by reference), the three tines are arranged in a row, with the center tine offset from the outer two tines so that the edge of the circuit card may be inserted between the three tines to pre-assemble the card with the clip, and with the card being held in place by spring action of the tines engaging portions of the card. With this arrangement, the center tine is positioned adjacent to the contact pad, and carries a solder preform, such as a cylindrical slug of solder, which is subsequently melted so as to bond the clip to the pad area and to connect the pad electrically to the clip for external contact purposes.

In such a prior construction, as typified by the Seilder patent, the solder preform is carried by the center tine a fixed distance above the substrate surface and pad area to be bonded, for example 0.010 inches (0.25 mm) in a typical prior-art example. This spacing or gap between preform and substrate has led to problems in initiating solder flow to the substrate and in obtaining a good solder joint, as discussed in further detail toward the end of the following "Detailed Description."

SUMMARY OF THE INVENTION

A specific object of this invention is to provide improved spring clip connectors and methods of assembly, of the general type discussed above, in which a solder preform is carried by a central tine of a spring clip in a position where it engages or is in substantial contact with the surface of a substrate having a contact pad area to be soldered, so as to improve the initial solder flow characteristics of the solder to the substrate and to provide an improved solder joint.

More general objects are to provide improved edge connectors and methods of assembly, wherein portions of a connector are formed about portions of a solder preform so as to position portions of the preform in substantial contact with portions of a circuit to be soldered to the connector.

With the foregoing and other objects in view, an edge connector and method of assembly in accordance with certain features of the invention is designed for making electrical contact with a contact pad area along an edge of a circuit card. The connector is of the type including elements for engaging and holding portions of the card adjacent to the edge upon pre-assembly of the card with the connector. The connector also carries a solder preform that is melted after the connector and card have been pre-assembled so as to bond portions of the connector to the pad area on the card. In accordance with certain features of this invention, the connector includes a deformable finger member that is formed about portions of the solder preform so as to shape the preform into a deformed configuration in which the ends of the preform are positioned in substantial contact with portions of the contact pad area to be soldered when the card and connector have been pre-assembled.

Preferably, the finger member is a spring finger or tine that projects from the connector and has a generally C-shaped end portion that is crimped about a central portion of the solder preform so as to deform the preform into a generally hourglass configuration. In one example, the connector includes a spring clip having at least three spring fingers projecting therefrom and arranged in a row, with the center finger offset from the outer two fingers so as to define a card receiving space between the fingers into which the card may be inserted to pre-assemble the card and clip. The fingers are located so that the card is held in place between the fingers by spring action of the fingers engaging portions of the card adjacent to the edge upon pre-assembly of the card with the connector, and the central finger is formed with a C-shaped end portion crimped about a central portion of the solder preform.

Other objects, advantages and features of the invention will be apparent from the following detailed description of a specific embodiment thereof, when read in conjunction with the accompanying drawings.

DETAILED DESCRIPTION

Figure 1:
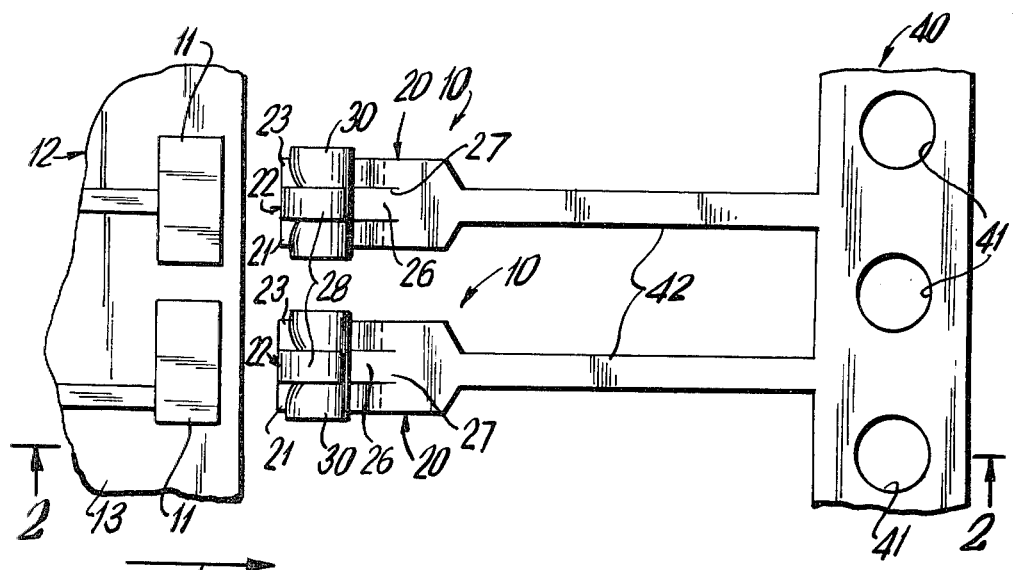
FIG. 1 is a plan view of a pair of edge connectors in accordance with one specific embodiment of the invention, also illustrating a portion of a circuit card about to be pre-assembled with the connectors.
Figure 2:
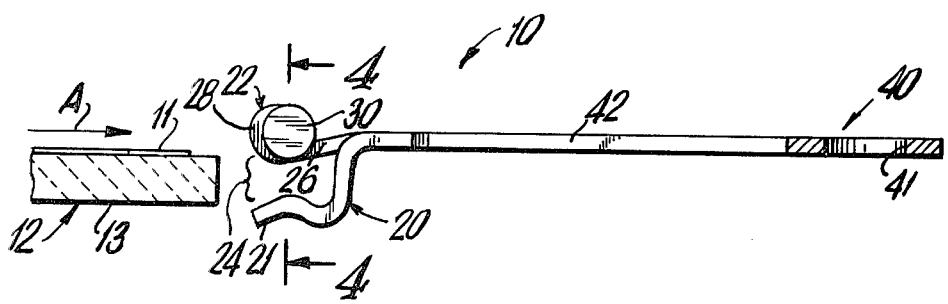
FIG. 2 is a front view of one of the connectors and a portion of the card, taken partially in section along line 2—2 in FIG. 1.
Figure 3:
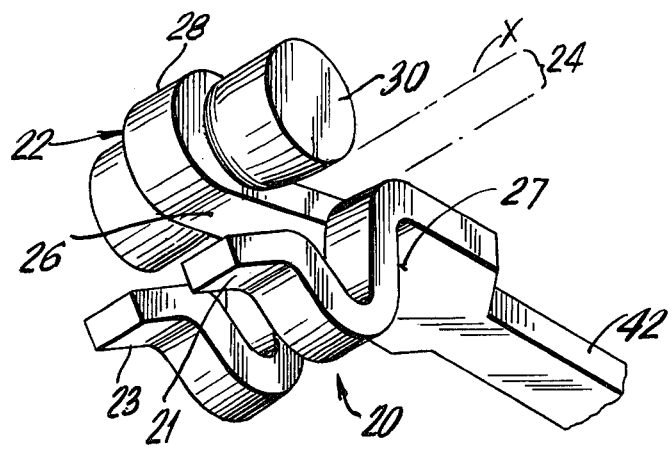
FIG. 3 is an enlarged perspective view of the contact portions of the connector illustrated in FIGS. 1-2.

Referring now in detail to the drawings, and particularly to FIGS. 1-3, a pair of edge connectors 10 in accordance with one specific embodiment of the invention are designed for making secure mechanical and electrical contact with a pair of corresponding contact pad areas 11—11 deposited along a front edge of a circuit card 12, the right side edge as viewed in FIGS. 1-2. The circuit card 12 may be any type of "printed" or deposited circuit having contact pads or lands 11—11 deposited along one edge of a substrate 13, for connection of circuitry (not shown) formed on the card to the outside world, as is well known. In a specific example, the circuits are "thin film" circuits involving miniature conductive, resistive and capacitive patterns deposited by metallizing techniques on a rigid substrate, such as ceramic or glass, although the invention may also be used with conventional "thick film" circuits, or with any other type of circuit having contact pads along one edge of a substrate that can be connected by edge connectors 10 of the type under consideration herein.

Each of the edge connectors 10 includes a spring clip 20 having a set of three resilient fingers or tines 21-22-23 projecting therefrom and arranged at an outer or contact end thereof, this being the end facing the circuit card 12 or the left end as viewed in FIGS. 1 and 2. The outer two tines 21 and 23 are bent and formed (downward and leftward, as viewed in FIGS. 2-3) into an offset configuration, as illustrated, so as to define a space 24 between the inner facing surfaces of the center tine 22 and the outer tines 21-23, into which the circuit card 12 can be inserted as indicated by arrows A in FIGS. 1-2.

Figures 4, 5:
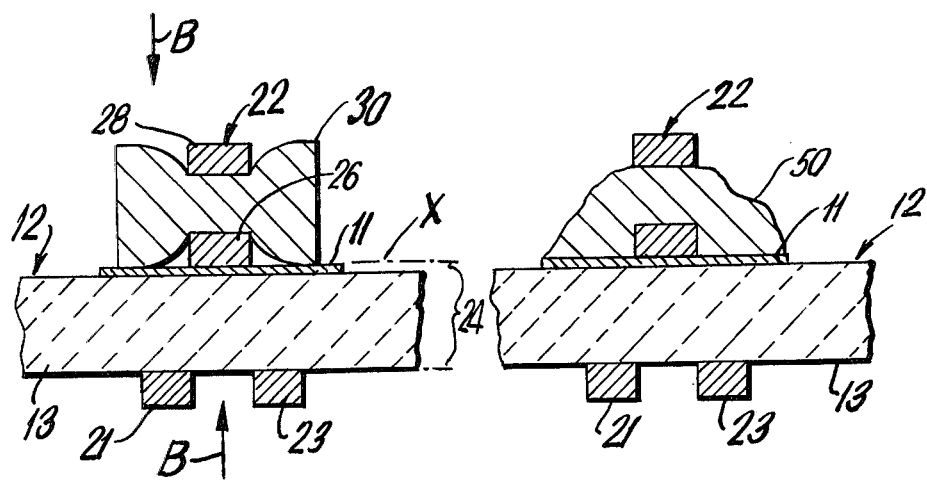
FIG. 4 is an enlarged vertical cross-section along line 4—4 of FIG. 2 illustrating the pre-assembly of the connectors and circuit card in preparation for a soldering operation.
FIG. 5 is a sectional view similar to FIG. 4, illustrating the parts after the soldering operation.

Preferably, the space 24 is slightly undersized with respect to the thickness of the card 12 so that the tines are spread slightly apart as the card is inserted into the space 24 to pre-assemble the clip with the card, and the card is then temporarily held in place within the clip by spring action of the contacting tines 21-22-23 engaging and holding portions of the card on either side in the pre-assembled position, as indicated by arrows B—B in FIG. 4. In a typical example, the space 24 is 0.022 inches (0.56 mm) for use with substrates 13 having a thickness of 0.025 inches to 0.030 inches (0.64 to 0.76 mm).

Preferably, the outer tines 21 and 23 are identical in shape and are bent into the generally S-shape illustrated in FIGS. 2-3 so as to bear against and contact the bottom surface of the card 12 on either side of the central tine 22, as viewed in FIG. 4. Other possible shapes and configurations for the outer tines 21-23 are illustrated in the Seidler patent, the main function being to define the card receiving space 24, with the center tine 22, and to exert the spring forces B for holding the card in the space after the card has been inserted into the space 24.

The center tine 22 has a generally straight first section 26 extending from its juncture 27 with the outer tines 21-23 toward the card 12 at a slight angle to the upper surface of the card 12, as shown in FIG. 2, and a generally C-shaped end section 28 curving away from the outer tines 21-23 as illustrated in FIGS. 2-3. The flat section 26 is designed to engage and support the top surface of the card 12, and to cooperate in holding the card in place by the spring action B as described previously. The C-shaped end section 28 is designed to carry a solder slug or preform 30 in a predetermined position with respect to the upper surface of the card. As illustrated in FIGS. 1 and 4, each individual preform 30 has a length (left-to-right in FIG. 4) essentially no longer than the length of the associated pad 11 (left-to-right in FIG. 4), and preferably shorter as illustrated in FIG. 4, so as to provide a coextensive solder joint on melting as described hereafter and as illustrated in FIG. 5.

In accordance with certain features of this invention, the C-shaped section 28 is crimped about the middle of the solder preform 30 so as to deform the preform 30 into a generally hourglass or "bowtie" configuration illustrated particularly in FIG. 4, in which the ends of the preform are positioned in substantial contact with portions of contact pad area 11 to be soldered when the card and clip have been pre-assembled as illustrated in FIG. 4. Preferably, the solder preform 30 is a short cylindrical piece or slug of any conventional solder wire, such as a 0.036 inch diameter by 0.07 inch long (0.9 mm by 1.8 mm) cylinder of a conventional "60/40" solder wire, containing 60% tin and 40% lead. Such solder wire is sufficiently malleable that the center tine 22 may easily be crimped about the center of the preform so as to shape the preform into the configuration illustrated. Preferably, the crimping action is such that the center section 26 of the tine 22 is aligned with the ends of the preform 30 along a plane X in FIGS. 3-4. With this arrangement, the ends of the preform are in resilient contact with the surface of the pads 11 to be bonded after the pre-assembly step, as illustrated in FIG. 4. (For purposes of illustration, the vertical dimension of the pad 11 is grossly exaggerated in FIGS. 2, 4 and 5.)

As is well known, and as is described in the Seidler patent, a plurality of the connectors 10 may be formed at spaced intervals and connected at one end to a single carrier strip 40 having pilot holes 41 for machine feed, so that a plurality of the clips may be assembled simultaneously with a plurality of adjacent contact pads 11 on the circuit card, but so that the carrier strip 40 and unwanted portions of connecting structure 42 can be later cut away, as is well known, to leave the individual connectors 10 joined to the edge of the card 12. The connectors 10 and supporting structure may be formed from spring metal strip stock by conventional stamping and forming processes, as generally described in the Seidler patent. In a typical example, the connectors are formed from a standard phosphor bronze strip stock 0.01 inches thick (0.25 mm).

After pre-assembly of the card 12 and connectors 10 as illustrated in FIG. 4, the solder preform is heated sufficiently to melt the solder and thus to form a solder joint 50 as generally illustrated in FIG. 5. In this operation, the substrate 13 and clips 20 are fluxed and then heated, such as by various conventional reflow soldering techniques, until the solder preforms 30 become molten and flow onto the adjacent portions of the contact pads 11 so as to form the final desired solder connection 50 between the clips 20 and the adjacent pad areas 11 of the circuit card 12. Thus, the clips are mechanically bonded to the desired areas of the card 12 and are electrically connected via the solder joints 50 to the individual circuits on the card via the contact pads 11.

A principal advantage of the present invention over prior-art clips such as are illustrated in the Seidler patent is that, with the solder preform 30 formed by the clip tine 22 into the hourglass configuration in which the ends of the preform are tangent to the inner surface of the tine 22 along the plane X, the ends of the preform 30 contact the surface of the substrate and of the pad 11 to be bonded, when the clip is pre-assembled with the substrate. This initial engagement of preform with substrate greatly enhances the flow of the melting solder to the substrate and provides a better bond. In the prior-art clips, the preform is positioned approximately 0.010 inches (0.25 mm) above the contact pad 11 and, during melting of the preform 30, the surface tension of the solder will sometimes cause the solder to draw together on top of the tine 22 and flow along the tine 22 away from the desired soldering area, and not flow down onto the contact pad 11 as required to form the desired connection.

While it is preferred to have the solder preform engage the substrate as described above, we have also found that intimate contact is not always necessary, and that a slight gap of 0.001 to 0.003 inches (0.025 to 0.075 mm) can be tolerated due to the action of the solder flux which is applied to the clip and preform prior to the soldering process. In view of this factor, the phrase "substantial contact" of the preform with the substrate, as used herein, means either actual contact as described in the preceding paragraphs, or positioning in very close proximity with a clearance of no more than 0.003 inches, as described in this paragraph.

In view of the foregoing description, it should be apparent that there has been provided a low cost, simple and effective edge connector for circuit cards, of the type in which a spring clip carrying a solder preform is used to make connections to contact pads on a substrate, and wherein improved solder flow characteristics are achieved by the formation and configuration of the clip finger (22) with respect to the solder preform (30). While one specific embodiment of the invention has been described in detail above, it should be apparent that various modifications may be made from the specific details described and illustrated without departing from the spirit and scope of the invention. While a connector design 10 is illustrated in which the tines 21–23 extend parallel to the body section 42 of the connector, it should be understood that various other configurations can be used, such as the 90° angled configuration shown in the Seidler patent.

What is claimed is:

1. An edge connector for a circuit card having at least one contact pad formed on a surface of a planar substrate adjacent to an edge thereof, which comprises:
   a clip having a plurality of spaced holding means projecting therefrom and defining a space therebetween for receiving the edge of the card, so that the holding means resiliently engage and hold portions of the card on either side of the substrate when the card is assembled with the clip; and
   an individual deformable solder preform for each contact pad, to be soldered to the clip and having a length essentially no longer than the length of the associated contact pad;
   the holding means including a deformable finger member of conductive metal for each solder preform, the finger member having a generally straight first section projecting from the clip for engaging a central portion of the contact pad on assembly of the card and clip and having a curved end section extending away from the first section and formed about a central portion of the solder preform so as to mechanically fasten the preform to the finger member and so as to position the preform in alignment with the associated contact pad on assembly of the card and clip;
   the solder preform being mechanically deformed with respect to the finger member so that the outer end surfaces of the preform facing the associated contact pad are positioned by the finger member in substantial contact with the adjacent surfaces of the contact pad when the clip and card have been assembled, whereby the solder preform can subsequently be melted to solder the clip to the associated pad, and whereby the substantial contact provided between the facing outer end surfaces of the preform and the adjacent surfaces of the contact pad enhances the flow of molten solder to the pad during the soldering process and inhibits a tendency of the molten solder to flow along adjacent portions of the clip and away from the soldering area.

2. An edge connector as recited in claim 1, wherein the generally curved end section of the finger member comprises a generally C-shaped end section crimped about the central portion of the solder preform so that the preform is mechanically deformed by the crimped finger member into a generally hourglass configuration in which the outer end surfaces of the hourglass-shaped preform facing the associated contact pad make said substantial contact with the adjacent surface S of the pad on assembly of the card and clip.

3. An edge connector as recited in 2, wherein the preform comprises a cylindrical slug of a malleable, conductive solder metal, deformed by the crimped finger into the hourglass configuration.

4. An edge connector as recited in claim 1, wherein the connector includes a spring clip having a plurality of spring fingers projecting therefrom and comprising the means for engaging and holding portions of the circuit card, one of the spring fingers having end portions comprising the deformable finger member carrying the solder preform.

5. An edge connector as recited in claim 4, wherein the clip includes at least three spring fingers arranged in a row and with the center finger offset from the outer two fingers so as to define the card receiving space between the fingers into which the card may be inserted to pre-assemble the card and clip, the fingers being located so that the card is held in place between the fingers by spring action of the fingers engaging portions of the card adjacent to the edge upon pre-assembly of the card with the connector.

6. An edge connector as recited in claim 5, wherein the center finger carries the solder preform and includes a generally C-shaped end portion crimped about a central portion of the preform so that the preform is deformed by the crimped finger into a generally hourglass configuration.

7. An improved edge connector for making electrical contact with a contact pad area along an edge of a circuit card, the edge connector being of the type including a spring clip having at least three resilient tines extending therefrom and arranged in a row, with the center tine being offset from the outer two tines so that the edge of the circuit card may be inserted between the three tines to pre-assemble the card and clip, with the card being held in place by spring action of the tines engaging portions of the card adjacent to the edge, and with the contact pad area to be connected being positioned adjacent to the center tine, the center tine carrying a solder preform to be melted after the clip and card have been pre-assembled so as to bond the clip to the pad area, wherein the improvement comprises:
   the center tine having a generally C-shaped end portion crimped about the middle of the solder preform so as to deform the preform into a generally hourglass configuration, the center tine being located so that the ends of the preform are positioned in resilient engagement with portions of the contact pad area to be soldered when the card and clip have been pre-assembled.

8. An edge connector as recited in claim 7, wherein the clip is fabricated from a flat piece of conductive spring metal strip stock, wherein the center tine includes a straight flat section extending generally horizontally from the clip in a plane generally parallel to the upper surface of a substrate to be assembled with the clip, the straight section making resilient contact with the upper surface of the substrate when pre-assembled, and wherein the outer two tines are bent downward and away from the central tine into a generally S-shaped configuration having contact surfaces generally parallel to those of the center tine for making resilient contact with the bottom surface of the substrate when pre-assembled.

9. The method of assembling an edge connector with a circuit card having a contact pad area along a first edge thereof, which comprises:
   (a) crimping a spring finger of the edge connector about a central portion of a solder preform so as to deform the preform into a generally hourglass configuration carried by the spring finger;
   (b) pre-assembling the circuit card with the edge connector so that portions of the connector engage and hold portions of the card adjacent to the first edge thereof, and so that the ends of the preform are positioned in substantial contact with portions of the contact pad area on the card; and then
   (c) melting the preform so as to bond portions of the connector to the adjacent pad area of the card.

10. The method of assembling an edge connector with a circuit card having a contact pad area along a first edge thereof, which comprises:
   (a) forming a piece of conductive spring metal into a spring clip having three resilient tines extending therefrom and arranged in a row, with the outer two tines being offset from the center tine so as to define a card-receiving space between the three tines into which the card may be inserted;
   (b) forming a C-shaped portion at the end of the center tine and crimping the C-shaped end portion about a central portion of a solder preform so as to deform the preform into a generally hourglass configuration carried at the end of the center tine;
   (c) pre-assembling the circuit card with the edge connector so that portions of the opposing tines resiliently engage and hold portions of the card on opposite sides thereof adjacent to the first edge of the card, and so that the central tine positions the ends of the preform in resilient engagement with portions of the contact pad area to be soldered; and then
   (d) melting the preform so as to bond portions of the clip to the adjacent pad area of the card.

* * * * *